United States Patent [19]

Hosten

[11] Patent Number: 4,976,840
[45] Date of Patent: Dec. 11, 1990

[54] ELECTROPLATING APPARATUS FOR PLATE-SHAPED WORKPIECES

[75] Inventor: Daniel Hosten, Handzame, Belgium

[73] Assignee: Siemens Aktiengesellschaft, Berlin and Munich, Fed. Rep. of Germany

[21] Appl. No.: 394,472

[22] Filed: Aug. 16, 1989

[30] Foreign Application Priority Data

Sep. 1, 1988 [DE] Fed. Rep. of Germany ....... 3829762

[51] Int. Cl.$^5$ ............................................. C25D 17/16
[52] U.S. Cl. .................................... 204/202; 204/206; 204/242; 204/275
[58] Field of Search ............... 204/198, 202, 225, 206, 204/242, 275

[56] References Cited

U.S. PATENT DOCUMENTS

| | | | |
|---|---|---|---|
| 4,385,967 | 5/1983 | Brady et al. | 204/27 |
| 4,755,271 | 7/1988 | Hosten | 204/198 |
| 4,776,939 | 10/1988 | Bläsing et al. | 204/202 |

Primary Examiner—John F. Niebling
Assistant Examiner—Kathryn Gorgos
Attorney, Agent, or Firm—Hill, Van Santen, Steadman & Simpson

[57] ABSTRACT

An electroplating apparatus for plate-shaped workpieces, particularly printed circuit boards which are guided through an electrolytic solution in a horizontal path for the application of metal has a conveying arrangement comprising laterally arranged upper band drives and laterally arranged lower band drives whereby the workpieces are entrained in a friction-actuated fashion between a lower run of the upper band drive and an upper run of the lower band drive. In addition, a sealing wall is arranged between the upper and lower runs of each of the band drives to produce a sealing arrangement for a laterally exposed edge of the workpiece, which is engaged by a contacting mechanism for the cathodic contacting of the workpiece projecting through the band drives.

15 Claims, 3 Drawing Sheets

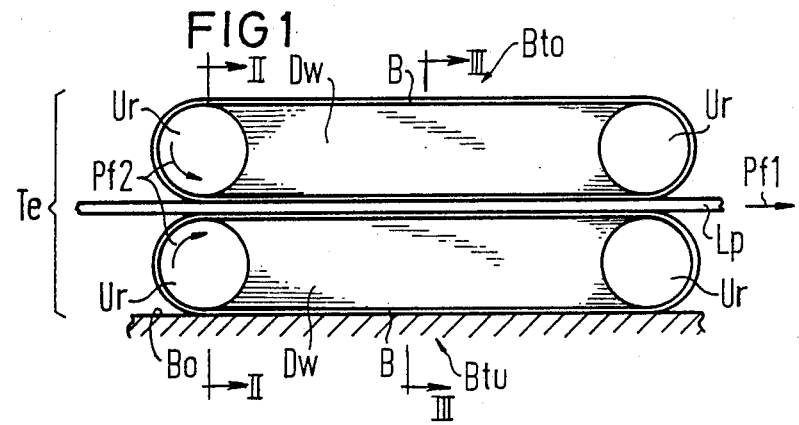
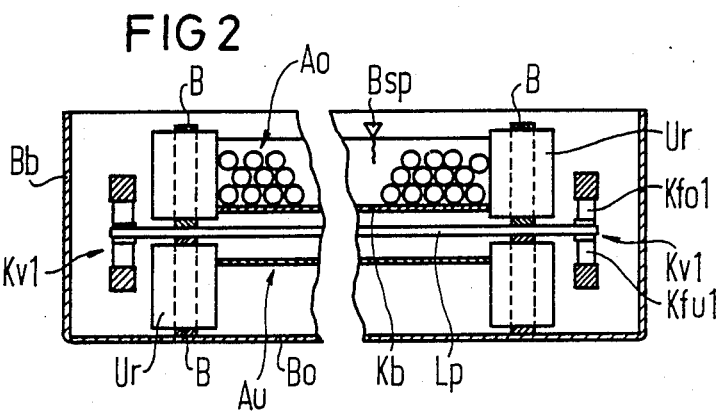
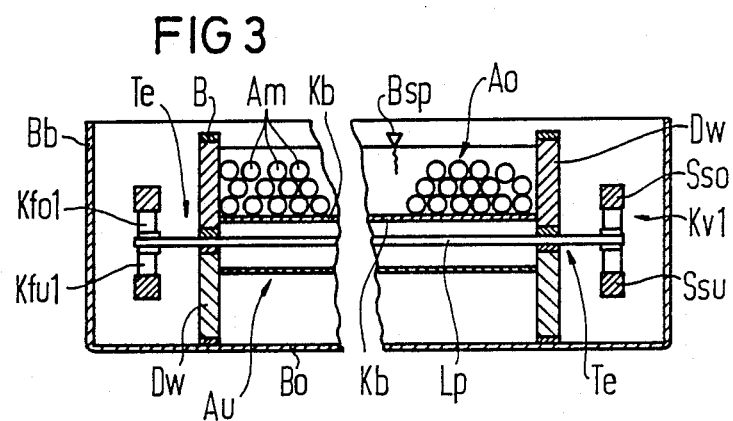

ELECTROPLATING APPARATUS FOR PLATE-SHAPED WORKPIECES

RELATED APPLICATION

The present invention is related to my U.S. Pat. application Ser. No. 394,725, filed Aug. 16, 1989, and to my U.S. Pat. application Ser. No. 394,536, filed Aug. 16, 1989.

BACKGROUND OF THE INVENTION

The present invention is directed to an electroplating apparatus for plate-shaped workpieces, particularly printed circuit boards, which workpieces are conducted through an electrolyte solution in a horizontal path for the application of a metal thereto.

An electroplating apparatus for electroplating plate-shaped workpieces moving in a horizontal path is disclosed in U.S. Pat. No. 4,385,967, whose disclosure is incorporated herein by reference thereto, and which was the basis of German DE-A 32 36 545. In the apparatus of this patent, plate-shaped workpieces are conducted through an electrolyte solution in a horizontal path. Feed of the workpieces occurs by driven contact wheels that are arranged at one side in the treatment cell and also simultaneously serves as a contacting mechanism for the cathodic contacting of the workpieces. Shieldings extending in the throughput direction and having sealing ledges press against the respective workpieces are provided for protecting the contact wheels against the electrolyte solution. A special guide fastener, which is arranged at the side of the treatment cell opposite to the contact wheels, is arranged for guiding and holding the workpieces.

In the electroplating apparatus described above, the employment of the sealing ledges cannot adequately prevent the access of electrolyte solution to the lateral contacting region of the workpiece and to the contact wheels. As a consequence of these incomplete seals, spongy metal depositions occur in the contact region, a rapid deterioration of the rolling contact occurs and unfavorable distribution of the layer thicknesses of the electrodeposited layers or, respectively, a great scatter of the layer of thicknesses, will occur.

U.S. Pat. No. 4,776,939, whose disclosure is incorporated herein by reference thereto and which was based on German Application No. 36 24 481, discloses an electroplating apparatus wherein the conveyor means is constructed as an endless circulating, driven row of individual conveyor elements that retain the lateral edge of the plate-shaped workpiece and move in a conveying direction. At the beginning of the conveying path, means are provided to create a grasping of the plate-shaped workpiece by the conveyor elements, and at the end of the conveyor path, means are provided to create a release of the plate-shaped workpiece by the conveyor elements which are being passed through the electrolysis chamber. Apart from the beginning of the grasping and the beginning of the releasing, no relative movement between the conveyor element and the workpiece edges will occur so that the wear phenomena or, respectively, abrasion phenomena of the conveyor elements is avoided. The conveyor elements can, thus, also simultaneously serve for supplying power to the plate-shaped workpiece.

U.S. Pat. No. 4,755,271, whose disclosure is incorporated herein by reference thereto and which is based on the same German Application as European Application A-0 254 962, discloses another type of electroplating apparatus of the above-mentioned type, wherein the contacting mechanism is formed by forceps-shaped contact clamps laterally displaceable together with the workpiece. These clamps are placed on an endless drive which, preferably, serves as a displaceable carrier of the contact clamps. The contact clamps also simultaneously serve as conveyor elements for the throughput of the workpiece. The contact clamps are shielded from the access of the electrolyte solution by a seal laterally extending in the throughput direction and resiliently pressing against the respective workpiece.

SUMMARY OF THE INVENTION

In electroplating apparatuses of both types of species, the object of the present invention is to further improve the shielding of the contact mechanism from contact with the electrolyte solution and to, thus, guarantee a better cathodic contacting of the workpiece.

In order to achieve these objects, an electroplating apparatus for plate-shaped workpieces, particularly printed circuit boards which are conducted through a container of electrolytic solution in a horizontal path for the application of metal, comprises at least one conveyor means arranged laterally relative to the throughput path and being composed of an upper band drive and a lower band drive for the friction-actuated entrainment of the workpiece between a lower run of the upper band drive and the upper run of the lower band drive for movement through the solution, a sealing wall being arranged between the upper run and lower run of each of the band drives and at least one contacting means being arranged laterally relative to the path of the workpiece for cathodically contacting the lateral edges of the workpiece projecting laterally beyond the band drives.

The lateral shielding of the contact mechanism is, thus, undertaken by the sealing bands firmly pressed against the surfaces of the workpiece whereby these sealing bands, as conveyor elements, simultaneously create the friction-actuated entrainment of the workpiece. Thus, with an especially low structural outlay and cost, a very good lateral shielding of the contacting means or mechanism against the access or contact of electrolyte solution is, thus, achieved. Moreover, no relative movement between the conveyor elements and the workpiece bands is established here, and, thus, wear phenomena of the conveying elements is avoided or eliminated.

In accordance with a preferred development of the invention, at least, respectively, one conveyor means is arranged on each side of the through path so that an especially reliable guidance of the workpiece is achieved. Since a two-sided shielding or, respectively, sealing occurs in this case, at least, respectively, one contacting mechanism can be arranged at each side of the throughput path for further improvement of the cathodic contacting.

As a result of the effective shielding of the contacting region, a stationarily arranged contacting mechanism can, thus, also be employed for wiper contacting of the workpiece. An especially high-grade, cathodic contacting is achieved in this case when the contacting mechanism comprises a plurality of contact spring pairs arranged at a distance from one another, whose contact springs lie opposite one another and press resiliently against the upper side and against the under side of the workpiece.

According to another modification, however, the contacting mechanism comprising contacting means synchronously corunning with the workpiece can also be provided. Thus, the relative movement in the workpiece and the contacting means present in the wiper contacting is eliminated in this particular instance. The contacting means are then, preferably, arranged on an endless drive belt that can be easily synchronized with the conveyor means.

Accordingly to a first embodiment of this modification, the contact means can be formed by an endless circulating bandshaped brush arrangement. It is provided, according to a second preferred embodiment, that the contacting means is formed by a plurality of contact spring pairs secured to an endless circulating metal band at a distance from one another, and the contact springs thereof lie opposite one another to resiliently press against the upper surface and the lower surface of the workpiece. In both embodiments, a cleaning means for cleaning the circulating contacting means can then be arranged in the region of a returning run or side of the endless band or belt. The cleaning means, which is preferably formed by an electrolytic demetalization cell, then effects an enhancement of the contactibility and, in particular, also effects the removal of the metal depositions that potentially occur on the contacting means.

Further advantages and features of the invention will be readily apparent from the following description of the preferred embodiments, the drawings and claims.

BRIEF DESCRIPTION OF THE DRAWINGS

FIG. 1 is a schematic side view of the conveyor and sealing arrangement of the present invention, which is composed of an upper and lower band drive;

FIG. 2 is a cross sectional view of an electroplating apparatus with the conveying and sealing arrangement of FIG. 1 with portions in elevation for purposes of illustration, taken approximately at line II—II of FIG. 1;

FIG. 3 is a cross sectional view of the electroplating apparatus of FIG. 2 taken approximately at line III—III of FIG. 1;

DESCRIPTION OF THE PREFERRED EMBODIMENTS

Figure 4:
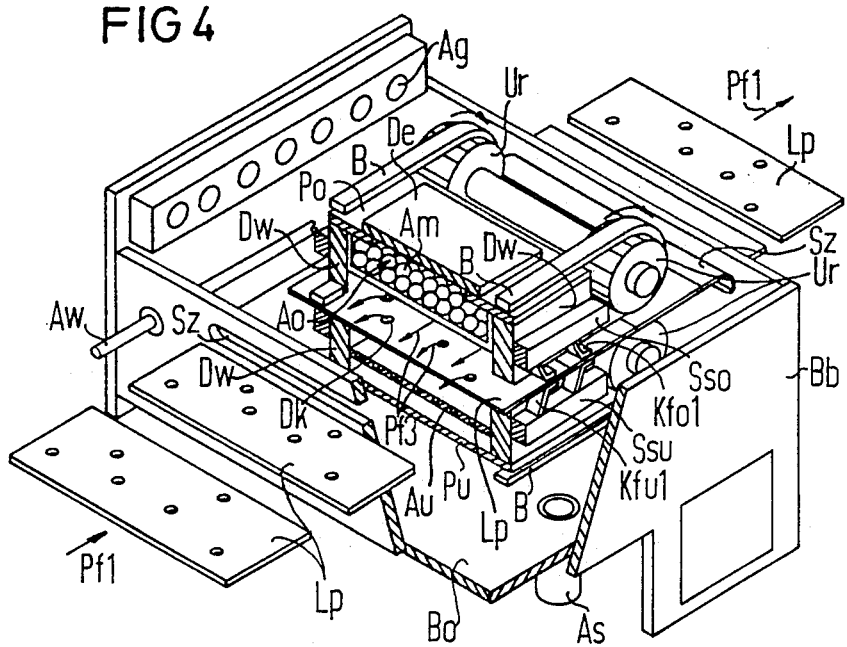
FIG. 4 is a perspective view with portions broken away for purposes of illustration of the apparatus of FIGS. 2 and 3.

The principles of the present invention are particularly useful when incorporated in a conveying means, generally indicated at Te, for conveying printed circuit boards Lp through an electrolyte solution (not illustrated) in a horizontal path or attitude in the direction of arrow Pf1. The conveying means Te is composed of an upper band drive Bto and a lower band drive Btu, wherein each of the band drives includes a band B which is endlessly circulating over two end rollers Ur, which are arranged at a distance to one another, and, thus, each of the bands B has an upper run and a lower run.

The end sheaves or rollers Ur for the upper band drive and for the lower band drive rotate in the direction of arrows Pf2 so that a printed circuit board Lp is drawn in on the left-hand side of FIG. 1 and is moved in the direction of the arrow Pf1 to be discharged on the right-hand end. As illustrated, the board will be gripped between the lower run of the upper band drive and the upper run of the lower band drive.

In the lateral regions of the printed circuit board Lp, the bands B will lie tightly against the upper surface and against the lower surface over the entire length so that no electrolyte solution can pass between the band B and the printed circuit board Lp. This sealing effect can be further intensified by utilizing bands B of a basically, especially elastic substance, such as rubber or the like. A comparative sealing effect then also occurs between the bands B and a sealing wall Dw that are arranged between the upper runs and the lower runs of each of the band drives Bto and Btu and are pressed tightly against the end sheaves Ur. When the lower run of the lower band drive Btu also lies tightly against a floor Bo of a container containing the electrolyte solution, then the upper band drive Bto and the lower band drive Btu, in combination with the sealing walls Dw, form a shielding that at least largely prevents the lateral emergence of any electrolyte solution. The end walls in the container of the electrolyte solution can also be used instead of having the sheaths Ur press against the ends of the sealing walls Dw. These end walls are provided with appropriate slots for the passage of the printed circuit board and of the band B. However, the rollers Ur continue to be present in this case as component parts of the conveyor means Te.

As illustrated in FIGS. 2 and 3, the drive arrangement Te of FIG. 1 is disposed in a bath container Bb of an electrolyte plating apparatus. The bath level of the electrolyte solution contained in the bath container Bb is thereby referenced Bsp. It may also be seen that a horizontally aligned, upper anode Ao that is composed of a basket Kb of expanded metal and of spherical anode materials Am is situated at a slight distance above the throughput path of the printed circuit board Lp. A lower anode Au that is likewise horizontally aligned is arranged at a slight distance under the throughput path of the printed circuit board Lp and this lower anode Au is constructed as an expanded metal sieve and, for example, is composed of a platinum-plated titanium. In contrast to the upper anode Ao that, for example, contains the copper balls as an anode material Am, the lower anode Au is, thus, an insoluble anode.

The cathodic contacting of the printed circuit boards Lp occurs by contacting mechanisms or means Kv1, which are arranged on both sides of the throughput path, and grasp the lateral edges of the printed circuit board Lp which project beyond the conveyor means Te that are, likewise, arranged on both sides. Each of the two contacting mechanisms Kv1 is thereby composed of an upper live rail Sso (see FIGS. 3 and 4) that carries a plurality of upper contact springs Kfol arranged at a distance from one another and of a lower live rail Ssu that carries a plurality of lower contact springs Kful arranged at a distance from one another. The upper contact springs Kfol and the lower contact springs Kful lie opposite one another in pairs and thereby provide a reliable wiping contacting of the printed circuit board Lp.

As may be seen without further ado, particularly in the cross section shown in FIG. 3, the two conveyor means Te in combination with the sealing walls Dw also fulfill the function of sealing devices that protect the contacting mechanisms Kv1 against deterioration due to access or contact with the electrolyte solution.

In the electroplating apparatus illustrated in FIG. 4, it can be seen that the two end walls of the bath container Bb are provided with horizontal slots Sz at the level of the throughput path identified by the arrow Pfl. These slots Sz enable the passage of the printed circuit boards Lp into the container and out of the container. The interior between an upper terminating hood (not shown in FIG. 4) and the bath container Bb is provided with an extractor Ag at one side that is connected to a central extractor or suction means for producing a vacuum or under-pressure in this space. A drive shaft Aw proceeding in the longitudinal direction extends under the extractor Ag, and this drive Aw drives the two illustrated upper end rollers Ur by bevel gear wheels that cannot be seen in greater detail.

The lateral delivery of the electrolyte solution into the bath container Bb (not shown in FIG. 4) and the discharge via a discharge connector As introduced into the floor Bo are dimensioned such that an upwardly directed flow indicated by the arrows Pf3 occurs via the through-contacting holes Dk of the printed circuit boards Lp. Insofar as other conditions are satisfied, this pronounced flow guarantees a qualitatively high-grade voltaic coating and strengthening of the through-contacting holes.

Departing from the cross sections shown in FIGS. 2 and 3, FIG. 4 shows an alternate wherein a horizontally aligned upper plate Po that extends transversely relative to the throughput direction is arranged between the two upper sealing walls Dw and the two upper runs of the upper band drive Bto. In order to be able to replace the anode material Am, the upper plate Po is provided with an opening that can be closed with a cover De. In a similar fashion, a lower plate Pu, that otherwise extends transversely relative to the throughput direction is arranged between the lower runs of the two lower band drives Btu (also shown in FIG. 1) and the lower edge surfaces of the lower sealing walls Dw.

Figure 5:
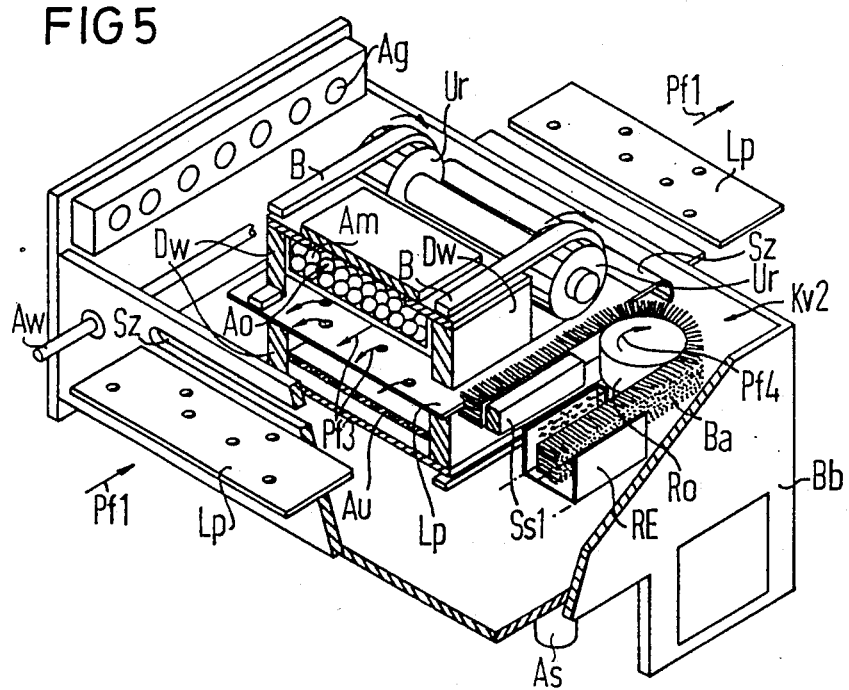
FIG. 5 is a perspective view of an electroplating apparatus with portions broken away for purposes of illustration having circulating band-shaped brush arrangements for a contacting mechanism.

FIG. 5 shows a modification of the electroplating apparatus shown in FIG. 4, wherein the contacting means or mechanism Kv2 having an endless circulating, band-shaped brush arrangement Ba, is provided instead of the contacting mechanism Kv1. This brush arrangement Ba circulates over two rollers Ro whereby one roller Ro is driven in a direction of arrow Pf4 so that the brush arrangement Ba co-runs synchronously with the printed circuit boards Lp. The supply of cathode current occurs by a stationarily arranged live rail Ss1 onto which the brush arrangement Ba slides. Thus, the current flows from the live rail through the brush arrangement Ba into the respective printed circuit boards Lp.

If undesirable metal depositions and agglomerations form on the brush arrangement Ba due to a potential emerging of the electrolyte solution, then these are in turn removed by a cleaning mechanism RE in the region of a return run of the brush arrangement Ba. This cleaning means RE is constructed as an electrolytic demetallization cell that contains an electrolyte solution, preferably the electrolyte solution employed in the electroplating apparatus. The demetalization then occurs with an anodic contacting of the brush arrangement Ba relative to a cathode situated in the cleaning mechanism RE.

Figure 6:
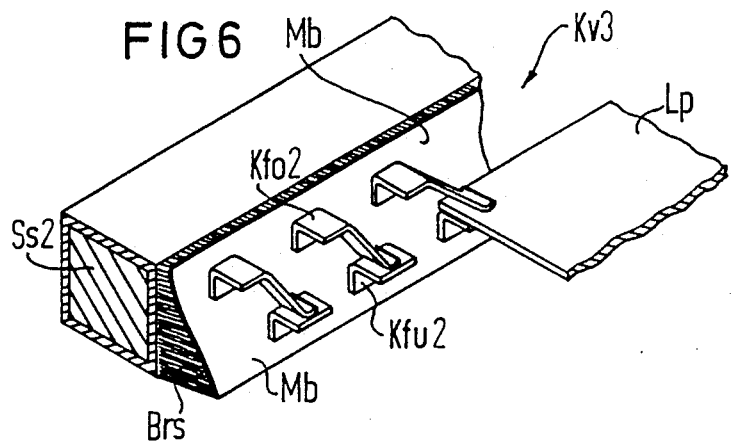
FIG. 6 is a partial perspective view with portions broken away of an embodiment of the circulating band-shaped contacting arrangement utilizing spring pairs.

Another modification of the contacting means or mechanism is illustrated by the contacting means or mechanism Kv3 in FIG. 6. The contacting mechanism Kv3 is also a contacting means that coruns synchronously with the printed circuit boards Lp and is formed by a plurality of contact spring pairs secured to an endless circulating metal band Mb at a distance from one another. Each of the contact pairs is composed of an upper contact spring Kfo2 and a lower contact spring Kfu2, which lie opposite one another. The lateral edge of the printed circuit board is accepted between these upper and lower contact springs, which apply a certain resilient contact pressure thereto. A power supply to the metal band Mb occurs by a live rail Ss2 which is arranged stationarily along the back side of the band Mb and forms a contact therewith by brushes Br2. The live rail Ss2 is preferably formed by a titanium-cladded, solid copper conductor. The brushes Brs are preferably composed of copper, whereas titanium has proven extremely good as a metal for the metal band Mb and for the contact springs Kfo2 and Kfu2. The cleaning or respective demetallization of the contact springs Kfo2 and Kfu2, according to the principles shown in FIG. 5, are possible by providing a cleaning means RE to engage a return run of the band and springs.

Although various minor modifications may be suggested by those versed in the art, it should be understood that I wish to embody within the scope of the patent granted hereon all such modifications as reasonably and properly come within the scope of my contribution to the art.

I claim:

1. An electroplating apparatus for plate-shaped workpieces moving in a horizontal path, said apparatus comprising a container for an electrolytic solution having at least an anode extending in a horizontal direction, at least one conveyor means arranged laterally relative to the path, said at least one conveyor means being composed of an upper band drive and a lower band drive for the friction actuated entrainment of the workpiece between a lower run of the upper band drive and an upper run of the lower band drive, at least one contacting means being arranged laterally relative to the path and said band drives for the cathodic contacting of a lateral edge of the workpiece which projects beyond the band drives, and a sealing wall being arranged between the upper and lower runs of each of the band drives to form means for sealing the contacting means from the solution in the container.

2. An electroplating apparatus according to claim 1, which includes at least one respective conveyor means arranged on both sides of the path.

3. An electroplating apparatus according to claim 2, which includes a contacting means arranged on both sides of the path.

4. An electroplating apparatus according to claim 1, wherein the contacting means is a wiper contacting arrangement stationarily mounted in said apparatus.

5. An electroplating apparatus according to claim 4, wherein wiper contacting arrangement comprises a plurality of contact spring pairs arranged at a distance from one another, each contact spring pair comprising an upper and lower spring lying opposite one another and resiliently pressing against upper and lower surfaces of the workpiece passing therebetween.

6. An electroplating apparatus according to claim 1, wherein the contacting means comprises a synchronously co-running contact means moving with the workpieces.

7. An electroplating apparatus according to claim 6, wherein the contact means is arranged on an endless drive.

8. An electroplating apparatus according to claim 7, wherein the contact means is formed by an endless circulating bandshaped brush arrangement.

9. An electroplating apparatus according to claim 8, which includes a cleaning means for cleaning the circulating band-shaped brush arrangement, said cleaning means being arranged in a return run of the circulating band-shaped brush.

10. An electroplating apparatus according to claim 9, wherein the cleaning means is formed by an electrolytic demetallization cell.

11. An electroplating apparatus according to claim 7, wherein the contact means is formed by a plurality of contact spring pairs secured to an endlessly circulating metal belt at a distance from one another along the belt, each of the contact spring pairs comprising an upper and lower contact spring resiliently pressing against an upper and lower surface, respectively, of the workpiece disposed therebetween.

12. An electroplating apparatus according to claim 11, which includes a cleaning means for cleaning the circulating metal band and contact springs being arranged on a return run of said endless metal band.

13. An electroplating apparatus according to claim 12, wherein said cleaning means is formed by an electrolytic demetallization cell.

14. An electroplating apparatus according to claim 7, which includes cleaning means for cleaning the moving contact on said endless drive, said cleaning means being arranged on a return side of said endless drive.

15. An electroplating apparatus according to claim 14, wherein said cleaning means is formed by an electrolytic demetallization cell.

* * * * *